(12) United States Patent
Iwanaga et al.

(10) Patent No.: US 8,969,718 B2
(45) Date of Patent: Mar. 3, 2015

(54) ORGANIC COMPOUND AND SOLAR CELL USING THE SAME

(71) Applicant: Kabushiki Kaisha Toshiba, Minato-ku, Tokyo (JP)

(72) Inventors: Hiroki Iwanaga, Kanagawa (JP); Akihiko Ono, Tokyo (JP); Fumihiko Aiga, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/752,475

(22) Filed: Jan. 29, 2013

(65) Prior Publication Data
US 2013/0255780 A1    Oct. 3, 2013

(30) Foreign Application Priority Data
Mar. 28, 2012    (JP) .................................. 2012-074491

(51) Int. Cl.
*H01L 31/00*    (2006.01)
*H01L 51/00*    (2006.01)
(Continued)

(52) U.S. Cl.
CPC .............. *H01L 51/0036* (2013.01); *H01G 9/20* (2013.01); *H01L 51/0043* (2013.01);
(Continued)

(58) Field of Classification Search
USPC ........... 136/263; 252/500, 511; 528/377, 380; 524/589; 526/256; 977/734
See application file for complete search history.

(56) References Cited

U.S. PATENT DOCUMENTS

2012/0248878 A1 * 10/2012 Iwanaga et al. ................. 307/80

FOREIGN PATENT DOCUMENTS

| JP | 2009-267196 | 11/2009 | |
|----|-------------|---------|---|
| JP | 2011-144367 | 7/2011 | |
| JP | 2011-144376 | 7/2011 | |
| JP | 2011-222556 | 11/2011 | |
| JP | 2012-009814 | * 1/2012 | .............. H01L 51/42 |

OTHER PUBLICATIONS

Chen et al. (Polym. Chem., 2012, 3, 2244-2253).*
(Continued)

*Primary Examiner* — Shane Fang
(74) *Attorney, Agent, or Firm* — Amin, Turocy & Watson, LLP

(57) ABSTRACT

Embodiments of the present invention provide an organic semiconductor excellent in the photoelectric conversion efficiency and also a solar cell using the same. This organic semiconductor has a polymer structure comprising a repeating unit represented by the following formula (I): -[A-D]- (I). In the formula, A is a structure represented by

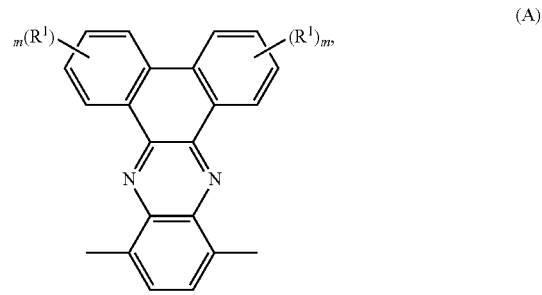

and D is a structure having a benzodithiophene skeleton or the like. In the above, $R^1$ is independently H, a substituted or unsubstituted straight-chain or branched-chain alkyl group, or a substituted or unsubstituted straight-chain or branched-chain alkoxy group. The solar cell according to an embodiment of the present invention comprises an active layer containing the organic semiconductor.

10 Claims, 1 Drawing Sheet

(51) Int. Cl.
  *H01G 9/20* (2006.01)
  *C08G 61/12* (2006.01)
  *H01L 51/42* (2006.01)

(52) U.S. Cl.
  CPC ........... *C08G 61/122* (2013.01); *C08G 61/126* (2013.01); *Y02E 10/549* (2013.01); *H01L 51/0037* (2013.01); *H01L 51/0072* (2013.01); *H01L 51/0074* (2013.01); *H01L 51/4226* (2013.01); *H01L 2251/308* (2013.01); *C08G 2261/122* (2013.01); *C08G 2261/124* (2013.01); *C08G 2261/126* (2013.01); *C08G 2261/1424* (2013.01); *C08G 2261/146* (2013.01); *C08G 2261/148* (2013.01); *C08G 2261/3241* (2013.01); *C08G 2261/3243* (2013.01); *C08G 2261/91* (2013.01); *Y10S 977/734* (2013.01)
  USPC ........... 136/263; 252/500; 252/511; 528/377; 528/380; 524/589; 526/256; 977/734

(56) References Cited

OTHER PUBLICATIONS

Durmus et al, New, Highly Stable Electrochromic Polymers from 3,4-Ethylenedioxythiophene-Bis-Substituted Quinoxalines Toward Green Polymeric Materials, Department of Chemistry, Chem. Mater. 2007, 19, 6247-6251.

Liang et al, Highly Efficient Solar Cell Polymers Developed via Fine-Tuning of Structural and Electronic Properties, JACS Articles, J.AM. Chem. Soc. 2009, 131, 7792-7799.

Liu et al, A Polymer-Based Ultrasensitive Metal Ion Sensor, Macromolecules 2009, 42, 7634-7637.

Japanese Office Action for Japanese Patent Application No. 2012-074491 mailed on Apr. 15, 2014.

Office Action of Notification of Reason for Rejection for Japanese Patent Application No. 2012-074491 Dated Jan. 31, 2014, 6 pgs.

* cited by examiner

ORGANIC COMPOUND AND SOLAR CELL USING THE SAME

CROSS-REFERENCE TO RELATED APPLICATIONS

This application is based upon and claims the benefit of priority from the prior Japanese Patent Application No. 2012-074491, filed on Mar. 28, 2012, the entire contents of which are incorporated herein by reference.

FIELD

Embodiments of the present invention relate to an organic compound and a solar cell device using the same

BACKGROUND

Organic thin-film solar cells can be produced by non-vacuum processes and hence have a merit of being mass-producible at low cost by simple coating processes such as printing, in contrast with inorganic material-based solar cells such as silicon solar cells and, for example, CIGS type of compound semiconductor solar cells. Further, since being in the form of thin films, they can serve as devices on flexible substrates of resins or the like. In addition, since they are also light in weight, it is possible to utilize their flexibility for designs thereof with high degree of freedom. Because of those advantages, the organic thin-film solar cells are expected to be next-generation solar cells. However, at present, their conversion efficiencies and working lifetimes are inferior to those of conventional solar cells, and accordingly it is said to be necessary to develop new device structures and/or materials.

In an early stage of the development, organic thin-film solar cells produced experimentally were of the pn-heterojunction (plane heterojunction) type comprising p- and n-type organic semiconductors. However, since the exciton diffusion length therein was as short as about ten nanometers, carriers were generated only within an area ranging from the pn-junction interface to some dozen nanometers depth and accordingly they had very low conversion efficiencies.

Figure 1:
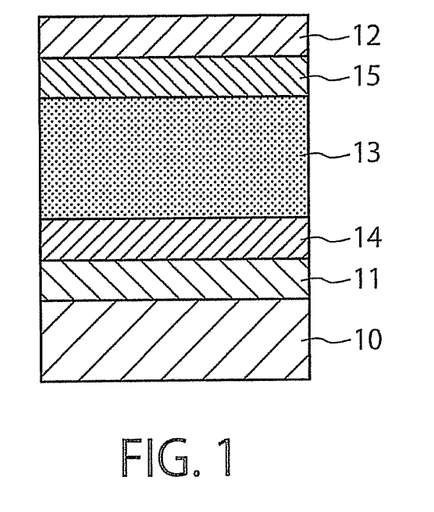
FIG. 1 shows a schematic sectional view of an organic thin-film solar cell according to an embodiment of the present invention.
Figure 2:
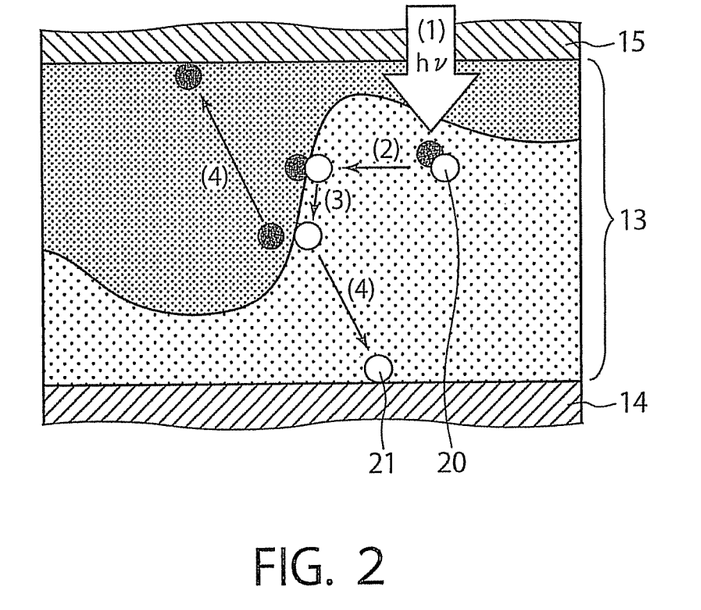
FIG. 2 shows a conceptual drawing illustrating the working mechanism of the solar cell.

In order to improve the conversion efficiencies of the above solar cells, bulk heterojunction (BHJ) technology is developed in which p- and n-type of organic semiconductors are blended so that the pn-junction interface of nano-order may be dispersed in the whole thin film. This technology is regarded as a breakthrough giving remarkable improvement of the conversion efficiency. FIG. 1 shows a schematic sectional view of a bulk heterojunction type solar cell, which comprises a substrate 10, an anode 11, a hole transport layer 14, an active layer (photoelectric conversion layer) 13, an electron transport layer 15, and a cathode 12. Further, FIG. 2 shows a conceptual drawing illustrating the working mechanism of the bulk heterojunction type solar cell.

The photoelectric conversion process in an organic thin-film solar cell is said to undergo the following steps:
(1) light absorption and exciton generation by organic molecules,
(2) migration and diffusion of the excitons,
(3) charge separation of the excitons, and
(4) charge transportation to both electrodes.

In the step (1), a p- or n-type organic semiconductor absorbs light to generate excitons 20. The generation efficiency in this step is hereinafter represented by "$\eta 1$". Successively in the step (2), the generated excitons migrate to the D/A hetero interface by diffusion. The diffusion efficiency in this step is hereinafter represented by "$\eta 2$". Since having lifetimes, the excitons can migrate only in as long a distance as the diffusion length. In the following step (3), the excitons reaching the pn-junction interface are then separated into electrons 21 and holes 22 (i.e., free carriers). The separation efficiency in this step is hereinafter represented by "$\eta 3$". Lastly, in the step (4), the free carriers are individually transported to the electrode through the p- or n-type organic semiconductor material and then introduced into the external circuit. The transportation efficiency in this step is hereinafter represented by "$\eta 4$".

Consequently, the external extraction efficiency $\eta_{IQE}$ of the carriers based on the applied photons can be represented by the formula of: $\eta_{IQE} = \eta 1 \cdot \eta 2 \cdot \eta 3 \cdot \eta 4$. This value corresponds to the quantum efficiency of the solar cell.

Accordingly, in order to increase the photoelectric conversion efficiency of organic thin-film solar cell, it is necessary to improve each of the steps (1) to (4).

Specifically, in the step (1), the active layer is required to absorb incident photons as efficiently as possible, preferably at the rate of 100%.

In the steps (2) and (3), the organic semiconductor materials are required to enhance mobility of the carriers and to ensure the pn-junction.

Further, in the step (4), it is required to form such carrier paths leading to the electrodes that the distance to each electrode may be shortened and it is also required to reduce defects acting as traps. If those requirements are satisfied, the photoelectric conversion efficiency can be improved.

Accordingly, if an organic thin-film solar cell is so produced that the above requirements may be satisfied, a device of high efficiency can be realized. However, as long as the production is based on practically available materials and film-forming methods, the requirements are difficult to satisfy sufficiently. For example, the organic p-type semiconductor polymer now adopted in the active layer has such a narrow absorption spectrum width that it can absorb light only within a particular small wavelength range. This is a large obstacle at present to improve the efficiencies of organic thin-film solar cells.

DETAILED DESCRIPTION

Embodiments will now be explained with reference to the accompanying drawings.

An organic compound according to an embodiment of the present invention has a polymer structure comprising a repeating unit represented by the following formula (I):

$$-[A-D]-\qquad\mathrm{(I)}$$

wherein

A is a structure represented by (A)

D is a structure selected from the group consisting of: structures represented by (D1)

(D2)

and (D3)

and thiophene, selenophene, oligothiophene, oligoselenophene, alkoxybenzene, tolan, thienothiophene, carbazole, fluorene, 3,4-ethylenedioxythiophene, cyclopentadithiophene, dithienothiophene, heptadecanylcarbazole, phosphafluorene, thiazolothiazole, pyridine, phenylthiophene, phenanthroline, phenanthrene, thiadiazole, crown ether, arylamine, diketo-pyrrolopyrrole, thiophene-benzene-thiophene unit, and derivatives thereof;

$R^1$ is independently H, a substituted or unsubstituted straight-chain or branched-chain alkyl group, or a substituted or unsubstituted straight-chain or branched-chain alkoxy group, provided that plural $R^1$s may be the same or different;

$R^2$ is independently a substituted or unsubstituted straight-chain or branched-chain alkyl group, a substituted or unsubstituted straight-chain or branched-chain alkoxy group, a substituted or unsubstituted phenyl group, a substituted or unsubstituted thienyl group, or a substituted or unsubstituted selenophene group, provided that plural $R^2$s may be the same or different;

m is independently an integer of 0 to 4, provided that plural ms may be the same or different;

X is independently an element selected from the group consisting of O, S, Se, Te and N, provided that plural Xs may be the same or different;

Z is an element selected from the group consisting of H, F, Cl, Br and I;

W is a substituted or unsubstituted straight-chain or branched-chain alkyl group, a substituted or unsubstituted straight-chain or branched-chain alkoxy group, or a ketone or ester group substituted with a substituted or unsubstituted straight-chain or branched-chain alkyl group; and V is a group selected from the group consisting of $—CR^3_2—$, $—SiR^3_2—$ and $—NR^3—$ in which $R^3$ is a substituted or unsubstituted straight-chain or branched-chain alkyl group, provided that, if there are two or more $R^3$s, they may be the same or different.

A solar cell according to an embodiment of the present invention comprises an active layer which contains an n-type semiconductor and the above organic compound.

Embodiments of the present invention will be described below in detail.

Organic Compound

For the purpose of solving the aforementioned problem, the present inventors have made attempts at expanding the absorption spectrum width of organic p-type semiconductor and thereby at increasing the current in the solar cell enough to improve the photoelectric conversion efficiency. As a result, it has been found that an organic compound which can function as an organic p-type semiconductor having a particular molecular structure enables to solve the above problem, and on the basis of this finding the present invention has been completed.

Specifically, the organic compound according to an embodiment of the present invention has a polymer structure comprising a repeating unit represented by the following formula (I): -[A-D]- (I).

In the formula, A is a structure represented by

(A)

and

D is a structure selected from the group consisting of: structures represented by (D1)

and thiophene, selenophene, oligothiophene, oligoselenophene, alkoxybenzene, tolan, thienothiophene, carbazole, fluorene, 3,4-ethylenedioxythiophene, cyclopentadithiophene, dithienothiophene, heptadecanylcarbazole, phosphafluorene, thiazolothiazole, pyridine, phenylthiophene, phenanthroline, phenanthrene, thiadiazole, crown ether, arylamine, diketo-pyrrolopyrrole, thiophene-benzene-thiophene unit, and derivatives thereof.

In the above, $R^1$ is independently H, a substituted or unsubstituted straight-chain or branched-chain alkyl group, or a substituted or unsubstituted straight-chain or branched-chain alkoxy group, provided that plural $R^1$s may be the same or different;

$R^2$ is independently a substituted or unsubstituted straight-chain or branched-chain alkyl group, a substituted or unsubstituted straight-chain or branched-chain alkoxy group, a substituted or unsubstituted phenyl group, a substituted or unsubstituted thienyl group, or a substituted or unsubstituted selenophene group, provided that plural $R^2$s may be the same or different;

m is independently an integer of 0 to 4, provided that plural ms may be the same or different;

X is independently an element selected from the group consisting of O, S, Se, Te and N, provided that plural Xs may be the same or different;

Z is an element selected from the group consisting of H, F, Cl, Br and I;

W is a substituted or unsubstituted straight-chain or branched-chain alkyl group, a substituted or unsubstituted straight-chain or branched-chain alkoxy group, or a ketone or ester group substituted with a substituted or unsubstituted straight-chain or branched-chain alkyl group; and V is a group selected from the group consisting of —$CR^3_2$—, —$SiR^3_2$— and —$NR^3$— in which $R^3$ is a substituted or unsubstituted straight-chain or branched-chain alkyl group, provided that, if there are two or more $R^3$s, they may be the same or different.

As described above, $R^1$ is H, a substituted or unsubstituted straight-chain or branched-chain alkyl group, or a substituted or unsubstituted straight-chain or branched-chain alkoxy group. Here, there are no particular restrictions on the number of carbon atoms in the alkyl group and in the alkoxy group. However, in view of the solubility in a solvent, the number of carbon atoms is preferably 10 or less, more preferably 6 or less. Further, $R^1$ may have a substituent unless it impairs the effect of the present invention, and examples of the substituent include hydroxyl, carboxyl, fluorine and chlorine. In view of the solubility of the organic semiconductor in a solvent, it is preferably substituted with a halogen atom.

Also as described above, $R^2$ is a substituted or unsubstituted straight-chain or branched-chain alkyl group, a substituted or unsubstituted straight-chain or branched-chain alkoxy group, a substituted or unsubstituted phenyl group, a substituted or unsubstituted thienyl group, or a substituted or unsubstituted selenophene group. There are no particular restrictions on the number of carbon atoms. However, in view of the solubility in a solvent, the number of carbon atoms is preferably 1 to 15, more preferably 5 to 10. Further, $R^2$ may have a substituent unless it impairs the effect of the present invention, and examples of the substituent include hydroxyl, carboxyl, fluorine and chlorine.

In the formula (I), A is a part functioning as an accepter of the organic semiconductor while D is a part functioning as a donor. The embodiment of the present invention is partly characterized by having a particular quinoxaline skeleton as the accepter structure. Specifically, this particular skeleton is a quinoxaline skeleton linking to two phenyl groups connecting to each other. On the other hand, D serving as a donor is selected from structures capable of functioning as a donor acting on the HOMO and LUMO levels of the accepter. Specifically, when D is selected from the above structures, the resultant organic semiconductor has excellent properties. Among them, particularly preferred is D1 (structure including a benzothiophene skeleton).

Further, the organic compound according to an embodiment of the present invention may have a polymer structure comprising not only the repeating unit of the above formula (I) but also a repeating unit represented by the following formula (II): -[A'-D]- (II).

In the formula, A' is a structure represented by and D is a structure selected from the same group as that in the formula (I). Here, A' differs from A in that two phenyl groups linking to a quinoxaline skeleton do not connect to each other.

In the above formula, although $R^1$ may be the same as that in the structure (A), m' is at most 5 because of the structural characteristics. If the repeating unit represented by the formula (II) is included in the polymer structure, the resultant organic semiconductor has improved solubility in a solvent. Since dissolved in a solvent and then cast to form a layer by spin-coating or meniscus coating, the p-type semi-conductor is required to have high solubility in the solvent and accordingly the polymer structure preferably contains the repeating unit of the formula (II).

In other words, the organic compound according to an embodiment of the present invention can be said to have a homo-polymer structure comprising the repeating unit represented by the formula (I) or otherwise to have a co-polymer structure comprising the repeating units represented by the formulas (I) and (II): -[A-D]$_k$-[A'-D]$_{k'}$- in which each of A, A' and D is the same as those described above and each of k and k' is a number indicating the polymerization degree provided that k is 1 or more, k' is 0 or more, and k+k' is 2 or more. Here, each of A, A' and D may have two or more different structures.

Particularly preferred is a co-polymer represented by the following formula (III):

In the above formula, each of $R^{1'}$ and $R^{2'}$ is independently H or a straight-chain or branched-chain alkyl or alkoxy group, provided that plural $R^{1'}$s and $R^{2'}$s may be the same or different; X is independently an element selected from the group consisting of S and Se, provided that plural Xs may be the same or different; m is independently an integer of 1 to 4, provided that plural ms may be the same or different; and m' is independently an integer of 1 to 5, provided that plural m's may be the same or different.

The co-polymer having the above structure has both high photoelectric conversion efficiency attributed to the repeating unit of the formula (I) and high solubility attributed to the repeating unit of the formula (II). In the case where $R^1$, particularly $R^1$ in the repeating unit A is a perfluoroalkyl group such as trifluoromethane, the photoelectric conversion reaches the peak of efficiency when the polymer structure includes the perfluoroalkyl-containing repeating units in an amount of 30% or less, for example, about 10% based on all the repeating units. Accordingly, even if including only a small amount of the perfluoroalkyl-containing repeating units, the resultant semiconductor can achieve high photoelectric conversion efficiency.

In the case where the organic semiconductor according to an embodiment of the present invention has a co-polymer structure, it may be a block copolymer or a random copolymer. Further, the repeating unit represented by the formula (I) or (II) may include a combination of two or more repeating units different in $R^1$, $R^2$, X, m or m'. This means that the co-polymer may comprise two or more different quinoxaline skeletons represented by the formula (I) or (II).

If using a normal quinoxaline polymer consisting of the same quinoxaline skeletons, the organic thin-film solar cell may suffer from problems on the conversion efficiency and stability because the polymer may form fine crystallites in the film-forming process to impair evenness and flatness of the formed layer. In contrast, a co-polymer comprising two different quinoxaline skeletons is so relatively highly amorphous that it hardly forms fine crystallites. Further, the properties of the polymer can be more flexibly controlled by selecting the kinds and combination of the two different quinoxaline skeletons. The p-type organic semiconductor used in an organic thin-film solar cell is required to have various properties in addition to the aforementioned absorption spectrum shape and deepened HOMO level. For example, it needs to be excellent in the morphology, in the dispersibility of the n-type semiconductor (fullerene) and in the contact of PEDOT/PSS interface adjacent to the anode. It is, therefore, an advantage in producing a desirable organic thin-film solar cell to be capable of flexibly controlling the properties.

Accordingly, the organic semi-conductor comprising the repeating unit of the formula (I) preferably contains two or more repeating units different in A. In contrast, the organic semiconductor comprising the repeating unit of the formula (II) essentially contains both A and A', which have different quinoxaline skeletons, in the structure. Even in that case, however, it is still preferred for the organic semiconductor to contain two or more repeating units different in A or in A' because the above effect is also obtained.

The organic semiconductor according to an embodiment of the present invention mainly comprises the above polymer structure, but the terminal thereof may be any structure as long as the effect of the present invention is not impaired. Specifically, there is normally a hydrogen atom at the terminal of the polymer chain, but it may be substituted with an alkyl group such as methyl, an aromatic group such as phenyl, hydroxyl, or other substituents such as carboxyl. If the polymer has a small molecular weight, the properties thereof can be modified by introducing a perfluoroalkyl group or a substituted phenyl group into the terminal position.

Since the organic semiconductor according to an embodiment of the present invention is a polymer of the above repeating units, the molecular weight thereof can be freely controlled by selecting the polymerization degree according to necessity. However, if the semiconductor has a low molecular weight, mobility of the carriers therein tends to be lowered. Accordingly, the organic semiconductor according an embodiment of the present invention preferably has a weight average molecular weight in terms of polystyrene in the range of 100000 or more. The larger the molecular weight is, the more it is preferred. However, if the molecular weight is too large, the solubility in the solvent is lowered. Accordingly, the molecular weight is preferably selected properly in consideration of the production process intended to be carried out.

Meanwhile, in general, if a π-conjugated system is expanded in a compound, the half width of its absorption spectrum tends to be so enlarged as to increase the absorption efficiency of light in a longer wavelength region. In the polymer comprising the repeating unit of the formula (I), therefore, the dithiophene skeleton functioning as a donor preferably has a tricyclic condensed ring while the part functioning as an acceptor is a quinoxaline skeleton condensed with another cyclic structure. Since having strong acceptability, the quinoxaline skeleton has an effect of lowering the HOMO level and hence can be expected to improve the open circuit voltage when used in a solar cell.

If one of R¹s is a perfluoroalkyl group, the absorption spectrum is shifted to the longer wavelength side and the HOMO level is lowered to further remarkable degrees. The relationships between the molecular structure and the maximum absorption wavelength and between that and the HOMO level depth were calculated according to the molecular orbital calculation based on the density functional theory. The results were as follows:

(II-1)

Depth of HOMO: 5.05 eV (calculated value)
Maximum wavelength: 485 nm
(calculated value)

(I-1)

Depth of HOMO: 5.07 eV (calculated value)
Maximum wavelength: 526 nm
(calculated value)

(I-2)

Depth of HOMO: 5.24 eV (calculated value)
Maximum wavelength: 580 nm
(calculated value)

As shown above, the p-type semiconductor of the formula (I-1) according to an embodiment of the present invention was verified to have a calculated HOMO level deeper than that of the formula (II-1). In addition, the absorption spectrum thereof was also verified to be shifted to the longer wavelength side. Specifically, the p-type semiconductor according to an embodiment of the present invention has a HOMO level (calculated value according to the molecular orbital calculation based on the density functional theory) of more than 5.0 eV, which is deeper than the HOMO levels of conventional organic semiconductors. Further, the HOMO level was found to be remarkably deepened in the p-type semiconductor of the formula (I-2) according to an embodiment of the present invention, and the absorption spectrum thereof was also found to be remarkably shifted to the longer wavelength side. Those results suggest that the open circuit voltage tends to be increased by the polymer having an acceptor part containing a fluorinated alkyl group as $R^1$.

Subsequently, the p-type semiconductor of the formula (I-2) according to an embodiment of the present invention was synthesized and then compared with PCDTBT (Poly[[9-(1-octylnonyl)-9H-carbazole-2,7-diyl]-2,5-thiophenediyl-2,1,3-benzothiadiazole-4,7-diyl-2,5-thiophenediyl]) and PTB7 (Poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]]), which are well known as p-type semiconductors of high efficiency, in respect to the actually measured absorption spectra and to the depths of HOMO levels actually measured and theoretically calculated by the molecular orbital calculation. The results were as set forth in Table 1. The calculation of the HOMO level depth was carried out according to the molecular orbital calculation based on the density functional theory, and the measurement thereof was conducted by the process in which the synthesized organic semiconductor was dissolved in dichlorobenzene and then spin-coated on a glass substrate equipped with ITO to form a sold thin film and the formed film was subjected to the photoelectron yield spectroscopy so as to determine the ionization potential and the work function.

PCDTBT

PTB7
EH = 2-Ethyl-Hexyl

TABLE 1

Comparison of actually measured absorption spectra and depths of HOMO

| Organic semiconductor | Maximum wavelength (nm) | Half width (nm) | Depth of HOMO (eV) | |
|---|---|---|---|---|
| | | | Calculated | Measured |
| PCDTBT | 575 | 130 | 4.91 | 5.36 |
| PTB7 | 660 | 150 | 4.64 | 5.14 |
| (I-2) according to an embodiment of the present invention | 615 | 150 | 5.24 | 5.67 |

As evident from Table 1, the organic semiconductor according to an embodiment of the present invention was expected to have a molecular structure giving a deep HOMO level on the basis of the calculation, and actually the HOMO level thereof was verified to be deep by the measurement.

In general, the longer wavelength the absorption maximum is positioned at and the larger half width the absorption spectrum has, the more suitably the organic semiconductor is used for a solar cell. The p-type organic semiconductor of the formula (I-2) according to an embodiment of the present invention shows an absorption spectrum in which the maximum wavelength is positioned at 615 nm, which is longer than that of PCDTBT, and the half width is also larger than that of PCDTBT. Although the absorption spectrum of PTB7 is positioned in a longer wavelength region than that of the p-type semiconductor of the formula (I-2), the p-type semiconductor of the formula (I-2) has a HOMO level deeper than PTB7. Accordingly, with respect to the open circuit voltage, the p-type semiconductor of the formula (I-2) is more advantageous. The results of studies described above indicate that the p-type semiconductor according to an embodiment of the present invention is capable of achieving high efficiency when used in a solar cell.

Production Process of Organic Thin-film Solar Cell Device

The following will describe the constitution and production process of a solar cell according to an embodiment of the present invention with reference to FIG. 1, which shows a schematic sectional view of a normal plane bulk heterojunction type organic thin-film solar cell. The solar cell according to an embodiment of the present invention may have any known constitution except for comprising a particular p-type semiconductor, and also may be produced by any process.

(Substrate)

The substrate 10 is a base supporting the device, and is preferably made of material which is not deteriorated by heat or organic solvent and which is excellent in light-transparency. Examples of the material include: (a) inorganic substances, such as, alkali-free glass and quartz glass; (b) plastics, such as, polyethylene, polyethylene terephthalate (PET), polyethylene naphthalate (PEN), polyimide, polyamide, polyamide-imide, liquid crystal polymer, and cycloolefin polymer; and (c) metals, such as, SUS and silicon. Since light must reach to the semi-conductor layer in the solar cell device, the electrode placed opposite to the substrate is preferably highly transparent if the substrate has low transparency. Further, since needing to be strong enough to support the device, the substrate is preferably thick enough to have such strength.

(Anode)

On the above substrate 10, the electrode (anode) 11 is formed. The anode can be normally produced by a process in which a film is formed from a transparent or semi-transparent electroconductive material according to vapor-deposition, sputtering, ion-plating, plating, coating or the like. The film of transparent or semi-transparent electro-conductive material is, for example, an electro-conductive metal oxide membrane or a semi-transparent metal membrane. Specifically, it may be a membrane (e.g., NESA) of electro-conductive glass comprising indium oxide, zinc oxide, tin oxide or a composite material thereof such as tin-doped indium oxide (ITO) or fluorine-doped indium oxide (FTO); or otherwise a metal film of gold, platinum, silver, copper or the like. Preferred is a membrane of ITO or FTO. Further, the electrode may be made of organic electro-conductive polymers such as polyaniline or derivatives thereof and polythiophene or derivatives thereof.

There are no particular restrictions on the thickness of the electrode 11. However, in the case of an ITO electrode, the thickness is preferably in the range of 30 to 300 nm. If it is thinner than 30 nm, the electroconductivity may be lowered to increase the resistivity and hence to impair the photoelectric conversion efficiency. On the other hand, if it is thicker than 300 nm, the electrode film may be cracked when suffering from stress. That is because ITO has no flexibility. The resistivity of the electrode is preferably as low as possible, and is normally not more than 10 Ω/square. The electrode layer may be a single layer or a laminate of plural materials having different work functions.

(Hole Transport Layer)

Subsequently, the hole transport layer 14 is formed. This layer has functions of leveling roughness of the lower electrode to prevent short-circuiting of the device, of transporting only holes efficiently, and of preventing annihilation of excitons generated near the interface of the active layer 13. The hole transport layer 14 can be made of any material used in known solar cells. For example, organic electro-conductive polymers can be used. Examples of the electro-conductive polymers include polyaniline, polypyrrole, and polythiophene polymers such as PEDOT/PSS (poly(3,4-ethylenedioxythiophene)-poly(styrenesulfonate)). Commercially available representative polythiophene polymers are, for example, Clevios PH500, Clevios PH, Clevios PV P AI 4083 and Clevios HIL1.1 ([trademark], manufactured by H. C. Starck). There are no particular restrictions on the film-forming process for producing the hole transport layer, as long as the process can form a film. For example, spin-coating can be adopted. In the case of using Clevios PH500, the layer preferably has a thickness of 20 to 100 nm. If being too thin, the layer often so insufficiently fulfills the function of preventing short-circuiting to the lower electrode that the device may short-circuit. On the other hand, if the layer is too thick, the membrane resistance may be increased to limit the generated current and hence to lower the photoelectric conversion efficiency. In the case where the layer is intended to be formed by spin-coating, the coating solution is preferably beforehand filtrated through a filter. After cast in a pre-determined thickness, the coating solution is generally dried, for example, on a hot-plate at 140 to 200° C. for about a few to 10 minutes.

(Active Layer)

A bulk hetero type organic thin-film solar cell is characterized by having a microphase-separated structure in which p- and n-type organic semiconductors are mixed in the same layer. In the solar cell according to an embodiment of the present invention, the p-type organic semiconductor is according to an embodiment of the present invention.

The n-type semiconductor is an electron-acceptor compound, and fullerenes and derivatives thereof have excellently suitable characteristics. There are no particular restrictions on the fullerene derivatives as long as they have fullerene skeletons. Specifically, the fullerene derivatives have basic skeletons of C60, C70, C76, C78, C84 and the like. Each of the carbon atoms constituting the fullerene skeletons may be surface-modified with any group, and the surface-modifying groups may be connected to each other to form a ring. The n-type semiconductor is preferably a fullerene derivative or a fullerene-containing polymer that comprises a functional group having high enough affinity for a solvent to be highly soluble therein.

Examples of the functional group contained in the fullerene derivatives include: (a) hydrogen, (b) hydroxyl, (c) halogen atoms such as fluorine and chlorine, (d) alkyl groups such as methyl and ethyl, (e) alkenyl groups such as vinyl, (f) cyano, (g) alkoxy groups such as methoxy and ethoxy, (h) aromatic hydrocarbon groups such as phenyl and naphthyl, and (i) aromatic heterocyclic groups such as thienyl and pyridyl. Examples of the fullerene derivatives include: hydrogenated fullerenes of C60H36 and C70H36, oxide fullerenes of C60 and C70, and fullerene metal complexes.

Among them, particularly preferred are 60PCBM ([6,6]-Phenyl C61 butyric acid methyl ester) and 70PCBM ([6,6]-Phenyl C71 butyric acid methyl ester). The fullerene derivatives are, for example, derivatives of C60 and C70. Examples of the structures thereof are shown below.

-continued

Examples of the unmodified fullerenes include C60 and, what is called, high order fullerenes such as C70, C76, C78 and C84. Since generating photo-carriers efficiently, C70 is preferably used in the organic thin-film solar cell.

For the purpose of forming the active layer by coating, the organic semiconductor must be dissolved in a solvent to prepare a coating solution. Examples of the solvent include: (a) unsaturated hydrocarbons, such as, toluene, xylene, tetralin, decalin, mesitylene, n-butylbenzene, sec-butylbenzene, and tert-butylbenzene; (b) halogenated aromatic hydrocarbons, such as, chlorobenzene, dichlorobenzene and trichlorobenzene; (c) halogenated saturated hydrocarbons, such as, carbon tetra-chloride, chloroform, dichloromethane, dichloroethane, chlorobutane, bromobutane, chloropentane, chiorohexane, bromohexane and chlorocyclohexane; and (d) ethers, such as, tetrahydrofuran and tetrahydropyran. Since having high solubility, halogenated aromatic hydrocarbons are particularly preferred. When used for spin-coating, the coating solution preferably has a solid concentration of 10 to 100 mg/mL.

The active layer is formed in a thickness properly controlled according to the kind of the used semiconductor and the structure of the cell, and the thickness is, for example, 40 nm to 200 nm inclusive.

(Electron Transport Layer)

Thereafter, the electron transport layer 15 is formed. This layer has functions of blocking holes and transporting only electrons efficiently and of preventing annihilation of excitons generated near the interface of the active layer 13. The hole transport layer 15 is made of, for example, metal oxide, such as, amorphous titanium oxide obtained by hydrolyzing titanium alkoxide according to the sol-gel method. There are no particular restrictions on the film-forming process for producing the electron transport layer, as long as the process can form a film. For example, spin-coating can be adopted. In the case of using titanium oxide, the layer preferably has a thickness of 5 to 20 nm. If being too thin, the electron transport layer becomes in the shape of islands in the sea and accordingly insufficiently fulfills the function of blocking holes. On the other hand, if the layer is too thick, the membrane resistance may be increased to limit the generated current and hence to lower the photoelectric conversion efficiency. In the case where the layer is intended to be formed by spin-coating, the coating solution is preferably beforehand filtrated through a filter. After cast in a predetermined thickness, the coating solution is generally dried, for example, on a hot-plate at 50 to 100° C. for about a few to 10 minutes so that the hydrolysis may be promoted in air, to form the electron transport layer.

(Coating Method)

When each layer is provided by casting a solution to form a membrane, the solution can be applied according to, for example, spin-coating, dip-coating, casting, bar-coating, roll-coating, wire bar-coating, spraying, screen printing, gravure printing, flexo printing, offset printing, gravure offset printing, dispenser printing, nozzle coating, capillary coating, or ink-jet printing. Those methods can be adopted singly or in combination.

In the case where the coating solution is cast on a cell having V-shaped grooves by means of a spin-coater, the cell is placed out of the center and the V-shaped grooves are positioned in the centrifugal direction so that the solution can evenly coat the surface. If the dip-coating is adopted, two V-shaped-grooved cells are laminated and then they are simultaneously subjected to the coating so as to protect their back surfaces from the coating solution.

(Cathode)

Lastly, the electrode (cathode) 12 is formed. The processes used for producing the anode are also usable for producing the cathode, and hence they can be selected to use. The cathode is, for example, a membrane of metal or electroconductive metal oxide. The electrode 12 is preferably made of a material having a low work function. Examples of the material having a low work function include Li, In, Al, Ca, Mg, Sm, Tb, Yb, Zr and LiF. The electrode layer may be a single layer or a laminate of plural materials having different work functions. Further, the electrode may be made of an alloy of one or more of those materials with other metals such as gold, silver, platinum, copper, manganese, titanium, cobalt, nickel, tungsten, and tin. Examples of the alloy include alloys of lithium-aluminum, lithium-manganese, lithium-indium, manganese-silver, manganese-indium, manganese-aluminum, indium-silver and calcium-aluminum. Among the above, Al and an alloy of manganese-aluminum are preferably used.

The electrode layer has a thickness of normally 1 nm to 500 nm, preferably 10 nm to 300 nm. If it is thinner than that range, the resistance may increase so much that the electrode cannot transmit generated charges into the external circuit. On the other hand, if the electrode is thicker than the above range, it takes such long time to produce the organic thin-film solar cell that the organic layers may be damaged to deteriorate the performance. In addition, since the material is more consumed and the production machine works for longer time, the thick electrode may increase the cost (Sealing Procedure)

In order to protect the device from oxygen and moisture, the device is preferably subjected to sealing treatment The device is generally sealed except for bare extracting electrodes connecting to the positive and negative electrodes, to produce the organic thin-film solar cell. The sealing treatment is carried out normally by use of sealants such as thermosetting or UV curable epoxy resins. Examples of the resins include PET, PEN, polyimide (PI), ethylene-vinyl alcohol copolymer (EVOH), epichlorohydrin rubbers (CO, ECO, GCO, GECO), ethylene-vinyl acetate copolymer (EVA), polycarbonate (PC), and polyether-sulfone (PE). The surfaces of those resins may be coated with a membrane of inorganic substances or metals (e.g., silica, titania, zirconia, silicon nitride, boron nitride, Al). Further, if desiccants and oxygen absorbers are incorporated in the sealed space, the device can be expected to have a long working lifetime.

If necessary, it is possible to provide an intermediate layer between the anode and the hole transport layer. The intermediate layer has functions of improving mobility of the carriers and of a carrier block to control the carrier balance. The intermediate layer comprises, for example, a fluorene skeleton-polymer such as PFO (poly(9,9-di-n-octyl-fluorenyl-2, 7-diyl)).

(Anti-Reflective Coating)

Since light is reflected by the surface of the substrate, it is preferred to provide an anti-reflective coating for reducing the reflection. If formed on both surfaces of the substrate, the anti-reflective coating maximally shows the effect thereof. However, the coating may be formed on only one surface.

It is possible to adopt a versatile anti-reflective coating or a sheet provided with an anti-reflective coating. Materials usable for the anti-reflective coating are, for example, inorganic substances such as titanium oxide and organic substances such as acrylic resin and polycarbonate resin. Those materials are formed into an anti-reflective coating of predetermined thickness and shape.

For use in a solar cell, the anti-reflective coating preferably has a moth-eye structure having fine convexes. Since the membrane having fine convexes has a refractive index changing continuously in the thickness direction, it hardly reflects light and hence can transmit light almost completely.

The moth-eye structure can be formed, for example, by the process in which first a mold having a fine relief pattern is produced by the nano-imprint process and then the pattern is transferred onto a resin sheet or an inorganic or organic SOG membrane.

Further, the technology for controlling self-assembling of titanium oxide makes it possible to form the anti-reflective coating by applying a paint giving the same anti-reflective function as the moth-eye structure.

(Wavelength Conversion Layer)

The efficiency can be improved if the solar cell comprises a layer that converts a short wavelength component of sunlight into light of long wavelength.

For example, if the substrate is coated with a europium complex, the photoelectric conversion efficiency can be increased by about 10%.

The present invention will be further explained below by use of the following examples.

EXAMPLE 1

The p-type semiconductor (weight average molecular weight: 192600) represented by the following formula (III-1) was synthesized.

The part corresponding to A in the formula (III-1) was synthesized according to Chemistry of Materials, 19(25), 6247-6251 (2007) or Macromolecules, 42(20), 7634, 7637 (2009). The part corresponding to D was synthesized according to J. Am. Chem. Soc., 131, 7792-7799 (2009). Thereafter, the organic semiconductor of the formula (III-1) was then synthesized by the steps of mixing the quinoxaline unit having $CF_3$ and the other quinoxaline unit in a molar ratio of 1:9 and then making them undergo a coupling reaction with the benzothiophene unit.

Subsequently, an organic thin-film solar cell shown in FIG. 1 was produced by use of the p-type organic semiconductor (III-1) synthesized above.

In the first step of the process for producing the organic thin-film solar cell, a coating solution for forming the active layer 13 was prepared in the following manner so that the solid concentration of the organic semiconductors might be a controlled value. First, the p-type organic semiconductor (III-1) and an n-type organic semiconductor (e.g., 70PCBM ([6, 6]-phenyl C71 butyric acid methyl ester), manufactured by Solenne BV) were mixed in a weight ratio of 1:4.

The mixture was so added in o-dichlorobenzene as a solvent that the solid concentration might be 24 mg/ml, and dissolved by exposing to ultrasonic wave at 50° C. for 2 hours with an ultrasonic cleaner (US-2 type [trademark], manufactured by AS ONE corporation), to prepare a coating solution K for forming the active layer 13. The coating solution K was then filtrated through a filter of 0.2 μm.

Independently, a glass substrate of 20 mm×20 mm and 0.7 mm thickness was prepared. On this glass substrate, an ITO transparent conductive layer of 140 nm thickness was formed by sputtering. The ITO layer was then subjected to a photolithographic process to obtain a glass substrate equipped with ITO patterned in the rectangular shape of 3.2 mm×20 mm.

The obtained substrate was subjected to ultrasonic cleaning for 5 minutes in pure water containing 1% of surfactant (NCW1001 [trademark], manufactured by Wako Pure Chemical Industries, Ltd.), and successively washed with flowing pure water for 15 minutes. After further subjected to ultrasonic cleaning for 5 minutes in acetone and then for 5 minutes in isopropyl alcohol (IPA), the substrate was dried at 120° C. for 60 minutes in an incubator.

Thereafter, the substrate was subjected to UV treatment for 10 minutes, so as to hydrophilize the surface.

The layers were formed by coating in the following manner.

The glass substrate equipped with ITO was spin-coated with a solution for forming the hole transport layer 14 in a thickness of 54 nm. The solution used here was an aqueous solution of PEDOT/PSS (poly(3,4-ethylenedioxythiophene)-poly-(styrenesulfonate) (Clevios PH500 [trademark], manufactured by H. C. Starck) beforehand filtrated through a filter of 0.1 μm. After that, the layer was dried on a hot-plate at 200° C. for 5 minutes.

Next, in a glove box purged with nitrogen, the above-prepared coating solution K for forming the active layer was dropped onto the hole transport layer 14, and spread by spin-coating to form an organic semiconductor layer of 90 nm thickness as the active layer 13. After that, the layer was dried on a hot-plate at 70° C. for 60 minutes in the same atmosphere.

Subsequently, for forming an amorphous titanium oxide layer as the electron transport layer 15, a solution obtained by the sol-gel method was used for the layer formation. Specifically, a solution of titanium oxide was prepared by the sol-gel method in the following manner. In a 500-mL three-neck flask (equipped with a stirrer, a reflux condenser and a thermostat) purged with nitrogen, 5 mL of titanium isopropoxide, 25 mL of 2-methoxyethanol and 2.5 mL of ethanolamine were placed, heated and refluxed at 80° C. for 2 hours and further at 120° C. for 1 hour. The obtained titanium oxide precursor solution was diluted 150 times with IPA, and filtrated through a filter of 0.2 μm.

The solution was then dropped onto the active layer 13, and spread by spin-coating to form an electron transport layer 15 of 15 nm thickness. After that, the layer was dried on a hot-plate at 80° C. for 10 minutes.

In the procedures of coating and drying the electron transport layer, titanium oxide was formed by hydrolysis reaction. The procedures were, therefore, carried out in air (so that moisture in air might be utilized for the reaction).

Thereafter, the cathode was formed by means of a vacuum vapor-deposition apparatus. In the deposition apparatus, the glass substrate equipped with ITO after coated with the active layer was mounted in a substrate holder, and then covered with a cathode-pattern mask. The pattern mask had a rectangular opening of 3.2 mm width, and was placed so that the pattern opening might cross the ITO layer. This means that the area size of the crossing part corresponded to that of the organic thin-film solar cell, and it was 0.1024 cm$^2$ (3.2 mm×3.2 mm). The apparatus was evacuated to 3×10$^{-6}$ torr, and then an Al source was volatilized by electric resistance heating to accumulate Al in a thickness of 80 nm.

After subjected to annealing, the substrate was sealed with sealing glass plates each of which was beforehand gouged to form a concave center. The glass plates were laminated with epoxy resin to seal the substrate.

Lastly, extracting electrodes were taken out from the positive and negative electrodes, to produce an organic thin-film solar cell.

The organic thin-film solar cell thus produced was evaluated on the photoelectric conversion efficiency r by means of an electric power measurement apparatus (manufactured by MAKI MANUFACTURING CO., LTD). The solar simulator gave irradiation illuminance of 100 mW/cm$^2$, and the light source for measurement was a standard light source simulating pseudo-sunlight of AM 1.5. Under this condition, electronic load was applied and the I-V characteristics were measured to determine the photoelectric conversion efficiency. As a result, the conversion efficiency was found to be 3.43%.

EXAMPLE 2

The procedures of Example 1 were repeated except for changing the solid concentration into 28 mg/mL. The conversion efficiency of the produced solar cell was found to be 3.31%.

EXAMPLE 3

The procedures of Example 1 were repeated except for changing the solid concentration into 32 mg/mL. The conversion efficiency of the produced solar cell was found to be 3.21%.

EXAMPLE 4

The procedures of Example 1 were repeated except for changing the solid concentration into 36 mg/mL. The conversion efficiency of the produced solar cell was found to be 2.78%.

EXAMPLE 5

The procedures of Example 1 were repeated except for changing the solid concentration and the ratio of p:n (ratio by weigh) into 28 mg/mL and 1:2, respectively. The conversion efficiency of the produced solar cell was found to be 2.87%.

EXAMPLE 6

The procedures of Example 1 were repeated except for changing the solid concentration and the ratio of p:n (ratio by weigh) into 28 mg/mL and 1:3, respectively. The conversion efficiency of the produced solar cell was found to be 2.88%.

COMPARATIVE EXAMPLE 1

The procedures of Example 1 were repeated except for using PCDTBT as the p-type organic semiconductor and for changing the solid concentration into 26 mg/mL. The conversion efficiency of the produced solar cell was found to be 2.72%.

As described above, solar cells comprising the p-type organic semiconductor according to an embodiment of the present invention were produced under variously changed conditions, and the conversion efficiencies thereof were measured. As a result, it was verified that high conversion efficiencies were stably given by the solar cells employing the p-type organic semiconductor according to an embodiment of the present invention under various conditions and also that those cells gave higher conversion efficiencies than the solar cell employing PCDTBT under the same conditions.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An organic compound which has a polymer structure comprising a repeating unit represented by the following formula (I):

-[A-D]-　　(I)

wherein A is a structure represented by (A)

D is a structure selected from the group consisting of:
structures represented by (D1)

(D2)

and (D3)

wherein the group from which D is selected further consists of structures comprising a skeleton from the group consisting of thiophene, selenophene, oligothiophene, oligoselenophene, alkoxybenzene, tolan, thienothiophene, carbazole, fluorene, 3,4-ethylenedioxythiophene, cyclopentadithiophene, dithienothiophene, heptadecanylcarbazole, phosphafluorene, thiazolothiazole, pyridine, phenylthiophene, phenanthroline, phenanthrene, thiadiazole, crown ether, arylamine, diketopyrrolopyrrole, thiophene-benzene-thiophene unit, and derivatives thereof;

$R^1$ is independently H, a substituted or unsubstituted straight-chain or branched-chain alkyl group, or a substituted or unsubstituted straight-chain or branched-chain alkoxy group, provided that plural $R^1$s may be the same or different and at least one of $R^1$ is a perfluoroalkyl group;

$R^2$ is independently a substituted or unsubstituted straight-chain or branched-chain alkyl group, a substituted or unsubstituted straight-chain or branched-chain alkoxy group, a substituted or unsubstituted phenyl group, a substituted or unsubstituted thienyl group, or a substituted or unsubstituted selenophene group, provided that plural $R^2$s may be the same or different;

m is independently an integer of 0 to 4, provided that plural ms may be the same or different;

X is independently an element selected from the group consisting of O, S, Se, Te and N, provided that plural Xs may be the same or different;

Z is an element selected from the group consisting of H, F, Cl, Br and I;

W is a substituted or unsubstituted straight-chain or branched-chain alkyl group, a substituted or unsubstituted straight-chain or branched-chain alkoxy group, or a ketone or ester group substituted with a substituted or unsubstituted straight-chain or branched-chain alkyl group;

V is a group selected from the group consisting of $-CR^3_2-$, $-SiR^3_2-$ and $-NR^3-$ in which $R^3$ is a substituted or unsubstituted straight-chain or branched-chain alkyl group, provided that, if there are two or more $R^3$s, they may be the same or different; and a repeating unit represented by the following formula (II):

-[A'-D]-　　(11);

wherein A' is a structure represented by (A')

D is a structure selected from the same group as that in the formula (1);

$R^{1\prime}$ is independently H, a substitute or unsubstituted straight-chain or branched-chain alkyl group, or a substituted or unsubstituted straight-chain or branched alkoxy group, provided that plural $R^{1\prime}$'s may be the same or different; and m' is independently an integer of 0 to 5, provided that plural m's may be the same or different, wherein A is the formula (1) includes two or more different repeating units.

2. The organic compound according to claim 1, wherein D comprises a benzothiophene skeleton.

3. The organic compound according to claim 1, which has a weight average molecular weight in terms of polystyrene in the range of 100000 or more.

4. The organic compound according to claim 1, wherein the depth of HOMO is calculated to be 5.00 to 5.30 eV according to the molecular orbital calculation based on the density functional theory.

5. The organic compound according to claim 1, which can form into a solid thin film in which the depth of HOMO is measured to be 5.2 to 6.0 eV by the photoelectron yield spectroscopy.

6. The organic compound according to claim 1, which is an organic semiconductor.

7. A solar cell comprising an active layer which contains an n-type semiconductor and the organic compound according to claim 1.

8. The solar cell according to claim 7, further comprising a substrate, an anode, a hole transport layer, an electron transport layer, and a cathode.

9. The solar cell according to claim 7, wherein the n-type semiconductor is selected from the group consisting of fullerenes and derivatives thereof.

10. The solar cell according to claim 7, further comprising an intermediate layer which contains a polymer having a fluorene skeleton and which is positioned between the anode and the active layer.

* * * * *